METHOD OF MAKING AN ELECTRONIC COMPONENTS PACKAGE

Filed June 4, 1954

INVENTOR
DAVID WILLIAMS
BERT GREENE

BY W. E. Thibodeau + A. W. Dew
ATTORNEYS

United States Patent Office 2,934,814

Patented May 3, 1960

2,934,814

METHOD OF MAKING AN ELECTRONIC COMPONENTS PACKAGE

David Williams and Bert Greene, Washington, D.C., assignors to the United States of America as represented by the Secretary of the Army Application June 4, 1954, Serial No. 434,684

1 Claim. (Cl. 29—155.5)

(Granted under Title 35, U.S. Code (1952), sec. 266)

The invention described herein may be manufactured and used by or for the Government for governmental purposes without the payment to us of any royalties thereon.

This invention constitutes an improvement in sandwich type construction methods of electronic component assembly.

There is need, in the electronic art, for component packaging devices which will offer such advantages as: ease of assembly, speed in assembly, ease of replacement, ease of testing of the components individually or as a unit, and low cost production.

One object of this invention is to provide a device for packaging electronic components, which device is inexpensive to fabricate and which lends itself to ease and rapidity of assembly, and which assembly can be readily accomplished by unskilled workers.

Another object of this invention is to provide a packaging method and device for electronic components which is adapted to be easily and conveniently incorporated into appropriate containing units.

It is an important object of this invention to provide a packaging method which permits ready access to the components in the package for replacement and testing without requiring disassembly of the package.

The specific nature of the invention as well as other objects and advantages thereof will clearly appear from the following description and drawing in which.

Figure 2:
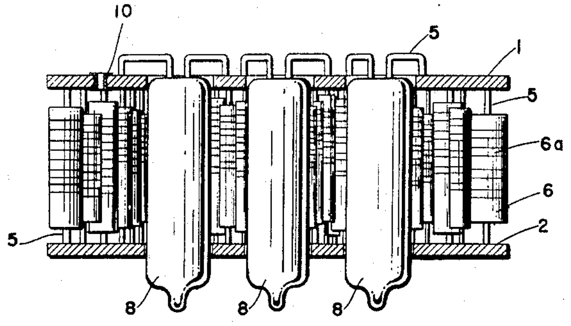
Figure 2 is a sectional elevation of the invention taken along line 2—2 of Fig. 1.
Figure 1:
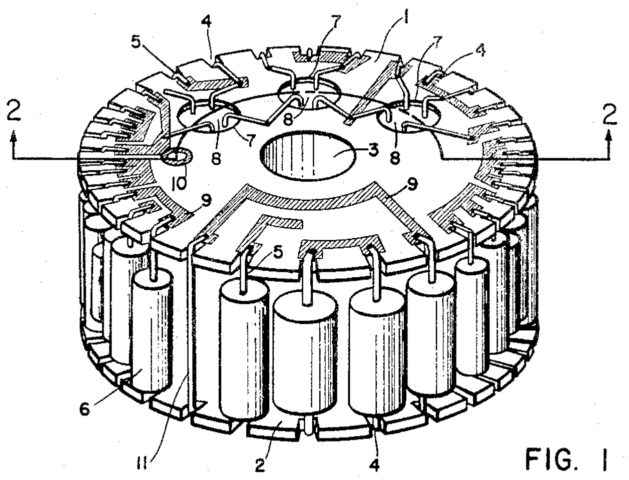
Figure 1 is a perspective view of the invention showing the assembled device.
Figure 3:
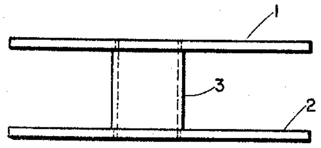
Figure 3 shows a method of mounting the support plates of the device upon the spindle.

Referring to the drawings, where like numerals indicate like members, numerals 1 and 2 indicate the top and bottom support plates, respectively. The support plates are fabricated from electrically non-conductive material. Connecting the two support plates and providing a mounting therefor is spindle 3. Each support plate is provided upon its periphery with a plurality of U shaped radial grooves 4 for accommodating the wire leads 5 of the electronic components 6. The electronic components are positioned between the two plates. Support plates 1 and 2 are provided with a plurality of holes 7 through which the electronic tubes 8 protrude and by which the tubes are partially supported. The support plates are also provided with printed conductors 9, which serve to "tie together" electrically the various components to form the desired circuit. The circuitry shown in Fig. 1 is only exemplary. If printing is desired on both sides of either support plate, any conductive element on one side of the plate may be connected to a conductive element on the other side by providing conductive eyelets 10 through the said support plates. Jumpers 11 may be used to conduct a conductive element of one support plate with a conductive element of the other support plate. The components 6 shown in Fig. 2 are resistors. They are normally marked with colored bands *6a* to indicate their value. The markings shown in Fig. 2 are only exemplary.

The electronic package is constructed as follows: Support plates 1 and 2 of a suitable electrically nonconductive material are cut or stamped to a shape which will adapt them, when assembled, to fit the containing unit, not shown. The usual and most desirable shape is circular. U shaped grooves 4 and circular holes 7 are punched through the plates either during or after the initial cutting or stamping operation. The grooves and holes are arranged to "tie in" with the printed circuitry 9 to be applied to the plates. The desired circuit is printed upon the support plates in any one of a number of ways well known to the art of printed circuitry. The conductive material may be printed on one plate or both, or may be printed on both sides of one plate or both as is needed to provide the desired electrical circuit. If the printed circuitry is on both sides of either plate the printed conductors may be connected, where necessary, by eyelets 10 or similar means inserted through the plate.

The plates are assembled, one on each end of a spindle 3. They are properly spaced on the spindle with respect to one another and at a distance sufficient to accommodate the longest component to be placed therebetween. Adhesive means or a press fit are used to secure the plates to the spindle.

The components can be assembled to the plates either individually or collectively. If done individually, each component is inserted between the two plates with each wire lead in an opposing U shaped groove. The leads are shown bent in Fig. 1. However, the leads need not be bent either before or after assembly. The leads are individually soldered to the conductive material surrounding the grooves. For mass production techniques, the components can be laid out side by side in the proper sequence and joined by a piece of tape running perpendicular to the axes of the individual components. Two pieces of tape can be used, one on each side of the row of components if desired. The whole series of components is then inserted into the several U shaped grooves. Each support plate is dipped into solder in order to bond into place in two operations all of the components. The outside piece of tape can then be removed if desired.

The other method of assembling the components is to place the spindle of the device on a mandril and under a hopper, not shown, and to rotate the mandril so that each component falls into its proper place. Holding means must be used on the components lest they fall out of the U shaped grooves before the soldering operation is performed. The components are dip soldered as before and the holding means are then removed.

It will be apparent that the embodiment shown is only exemplary and that various modifications can be made in construction and arrangement within the scope of the invention as defined in the appended claim.

We claim:

A method of assembling a substantially cylindrical package having electrical components, such as resistors, condensers and inductors, so that said components are readily accessible for removal from said package, said method comprising: cutting a pair of non-conductive circular support plates to the size and shape desired, cutting corresponding grooves in the periphery of each plate, printing conductive material as required upon said plates and surrounding said peripheral grooves, permanently mounting said plates upon a spindle in spaced parallel relationship so that said peripheral grooves of one plate axially align with said peripheral grooves of the other plate, said plates being so spaced as to receive a plurality of said electronic components therebetween with the distance between said plates sufficient to accommodate the longest of said electronic components, affixing said plurality of electronic components to a strip of adhesive tape in spaced parallel relationship with the longitudinal axis of the tape perpendicular to the axis of the components, wrapping said tape around the periphery of the package so that the leads of each component are inserted into the aligned peripheral grooves thereby contacting said conductive material, and dip-soldering each plate so as to bond said electronic components to said conductive material surrounding said peripheral grooves, the package thus formed providing ready accessibility to said components and permitting removal of same for testing without removing said plates from said spindle.

References Cited in the file of this patent

UNITED STATES PATENTS

| | | |
|---|---|---|
| 2,251,326 | Cullin | Aug. 5, 1941 |
| 2,353,061 | Oldenboom | July 4, 1944 |
| 2,443,574 | Burns | June 15, 1948 |
| 2,641,635 | Scal et al. | June 9, 1953 |
| 2,651,830 | Wilken et al. | Sept. 15, 1953 |
| 2,694,784 | Reinhard | Nov. 16, 1954 |
| 2,699,133 | Ames et al. | Jan. 11, 1955 |
| 2,771,663 | Henry | Nov. 27, 1956 |
| 2,774,051 | McCarthy | Dec. 11, 1956 |
| 2,779,094 | Christoffel | Jan. 29, 1957 |

FOREIGN PATENTS

| | | |
|---|---|---|
| 637,596 | Great Britain | May 24, 1950 |